US006613984B1

(12) United States Patent
Hensley

(10) Patent No.: US 6,613,984 B1
(45) Date of Patent: Sep. 2, 2003

(54) MEANS AND METHODS OF INSULATING A BOLSTER PLATE

(75) Inventor: James Hensley, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/135,165

(22) Filed: Apr. 29, 2002

(51) Int. Cl.⁷ .................. H01B 17/00; H01B 17/16
(52) U.S. Cl. ............... 174/138 G; 174/137 R; 174/166 S; 361/812; 403/408.1; 439/78
(58) Field of Search .................. 174/137 R, 138 R, 174/138 F, 138 G, 166 S, 171; 361/757, 807, 808, 809, 812; 439/78, 85; 403/408.1; 411/18, 22, 26, 32, 200, 217, 218, 219

(56) References Cited

U.S. PATENT DOCUMENTS

| | | | | | |
|---|---|---|---|---|---|
| 3,473,461 A | * | 10/1969 | King | ................ | 403/408.1 |
| 3,792,933 A | * | 2/1974 | Stencel | ................ | 403/408.1 |
| 5,044,966 A | * | 9/1991 | Friesen | ................ | 361/807 |
| 5,062,149 A | * | 10/1991 | Hulderman et al. | ........ | 174/323 |
| 5,754,412 A | * | 5/1998 | Clavin | ................ | 174/138 D |
| 5,766,740 A | * | 6/1998 | Olson | ................ | 174/138 G |
| 5,842,890 A | * | 12/1998 | Gimenez | ................ | 439/718 |
| 6,181,567 B1 | * | 1/2001 | Roemer et al. | ........ | 361/807 |
| 6,212,074 B1 | * | 4/2001 | Gonsalves et al. | ........ | 361/717 |
| 6,235,991 B1 | * | 5/2001 | Johnson | ................ | 174/138 D |
| 6,259,032 B1 | * | 7/2001 | Fernandez | ........ | 174/138 E |
| 6,362,978 B1 | * | 3/2002 | Boe | ................ | 361/807 |
| 6,424,538 B1 | * | 7/2002 | Paquin | ................ | 174/138 G |
| 6,506,062 B1 | * | 1/2003 | Patel et al. | ........ | 439/78 |
| 6,512,174 B2 | * | 1/2003 | Mori et al. | ........ | 174/52.1 |

* cited by examiner

Primary Examiner—Dean A. Reichard
Assistant Examiner—Adolfo Nino

(57) ABSTRACT

An insulator electrically insulates a bolster plate. The insulator preferably includes a sheet of insulating material sized and shaped to insulate the bolster plate and at least one hole through the sheet of insulating material for accommodating a fastener for securing the sheet of insulating material to the bolster plate.

41 Claims, 5 Drawing Sheets

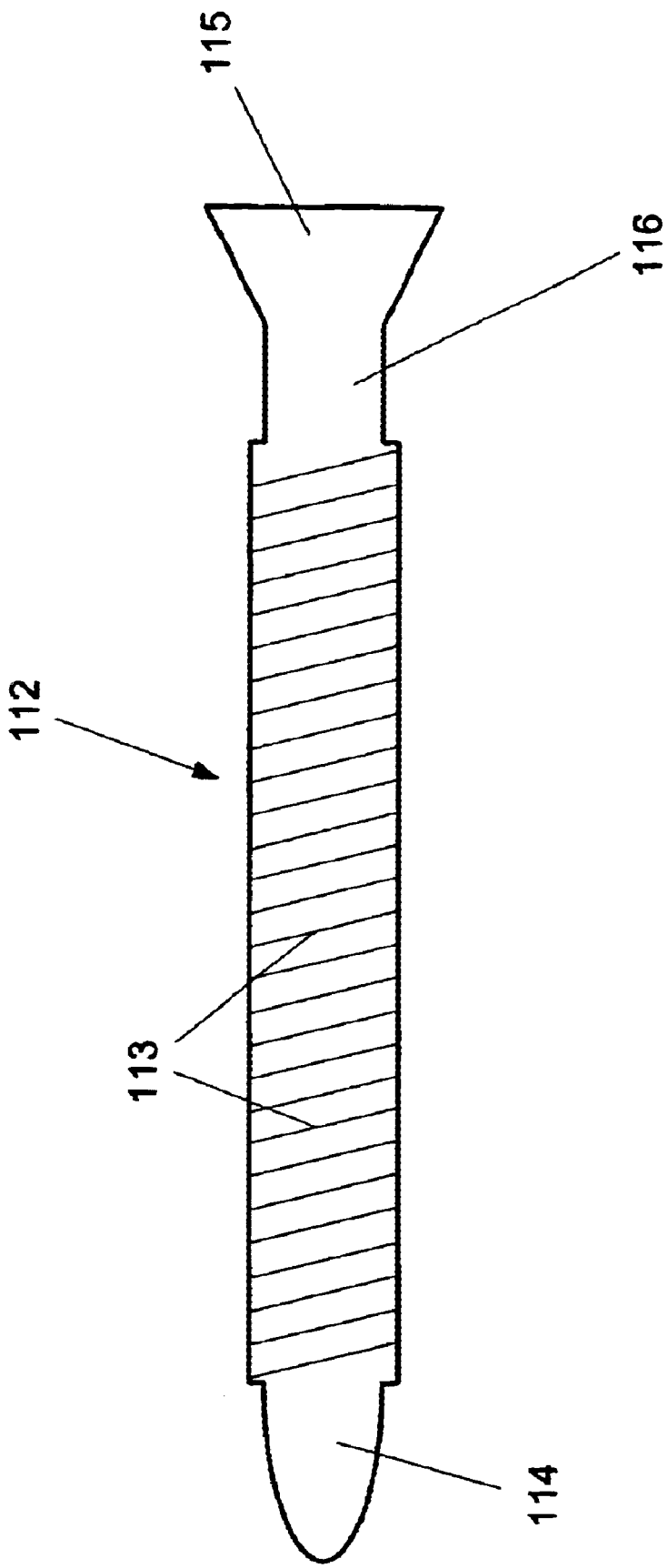

MEANS AND METHODS OF INSULATING A BOLSTER PLATE

FIELD OF THE INVENTION

The present invention relates to the field of using a bolster plate to support a circuit board, e.g., a backplane. More particularly, the present invention relates to the field of insulating the bolster plate from the supported circuit board.

BACKGROUND OF THE INVENTION

Computers and their peripheral devices are used for a wide variety of purposes including, data storage, communication, and document creation. Peripheral Component Interconnect (PCI) is a local bus that is commonly used to connect a computer with one or more peripheral devices. A PCI bus provides a high-speed connection with peripherals and can connect multiple peripheral devices to the host computer. The PCI bus typically plugs into a PCI slot on the motherboard of the host computer.

CompactPCI was introduced in 1995 and has since become one of the fastest-growing industrial bus architectures to date. Initially targeted at the telecommunications and industrial control markets, CompactPCI takes the popular PCI interface and packages it into a smaller, more rugged unit. The most noticeable change made to the architecture was the adoption of a form factor in which all dimensions and mechanical components are standardized by the Institute of Electrical and Electronics Engineers (IEEE). Consequently, numerous vendors can supply mechanically interchangeable components.

One particularly interesting use of the CompactPCI is in a blade server, also called an ultradense server. Blade servers are comprehensive computing systems that include processor, memory, network connections, and associated electronics, all mounted on a single motherboard called a blade. There are many types of blades - server blades, storage blades, network blades and more.

The server blade, along with storage, networking and other blades, are typically installed in a rack-mountable enclosure that houses multiple blades that share common resources such as cabling, power supplies, and cooling fans. With its modular, hot-pluggable architecture, the easily accessible blade server offers increased computing density while ensuring both maximum scalability and ease of management.

Blade servers are smaller than traditional rack-mounted servers and have thinner Printed Circuit Boards (PCBs). These thinner server PCBs require reinforcement for attachment of central processing unit (CPU) and Central Electronic Complex (CEC) chips much like their thicker rack-mounted counterparts. CompactPCI does not allow much physical room for the necessary bolster plates or their attachment hardware. It is very difficult to pre-assemble the necessary attachment hardware to the bolster plate prior to assembling it to the blade. The bolster plates require a high stiffness that often requires that they be constructed from a metallic material.

However, because the bolster plate is a metallic and, therefore, conductive component, the bolster plate must be insulated from the server blade or other circuit board that is being supported. Otherwise, the bolster plate may cause shorts in the circuit board being supported.

In the past, layers of insulation have been secured to the bolster plate with an adhesive. However, this tends to cause a number of problems.

First, this adhesive must be flame retardant so as to prevent the possibility of being ignited by the heat and electricity of the server blade or other adjacent circuit board. Thus, it becomes necessary to identify and use a Network Equipment Building Standards (NEBS) Level 3+ compliant flame-retardant adhesive, which poses some difficulty.

Additionally, such adhesives tend to wick out of the bonded joint between the bolster plate and the insulator. The adhesive then wicks up through the vias of the server printed circuit board or other supported circuit board. This causes contamination, and potential malfunction, of the supported circuit board.

SUMMARY OF THE INVENTION

In one embodiment, the present invention provides an insulator for electrically insulating a bolster plate. The insulator includes a sheet of insulating material sized and shaped to insulate the bolster plate and at least one hole through the sheet of insulating material for accommodating a fastener for securing the sheet of insulating material to the bolster plate.

In another embodiment, the present invention provides a sub-assembly that includes a bolster plate for supporting a circuit board and an insulator for insulating the bolster plate from the circuit board. The insulator is secured to the bolster plate with one or more fasteners. Preferably, these fasteners are screws where each screw has a threaded portion, a head and an unthreaded portion between the head and the threaded portion. The insulator and the bolster plate are held on the unthreaded portion of the screw between the threaded portion and the head.

In another embodiment, the present invention provides a method of forming a sub-assembly by providing a bolster plate for supporting a circuit board, providing an insulator for insulating the bolster plate from the circuit board and securing the insulator to the bolster plate with one or more fasteners.

Additional advantages and novel features of the invention will be set forth in the description which follows or may be learned by those skilled in the art through reading these materials or practicing the invention. The advantages of the invention may be achieved through the means recited in the attached claims.

BRIEF DESCRIPTION OF THE DRAWINGS

The accompanying drawings illustrate preferred embodiments of the present invention and are a part of the specification. Together with the following description, the drawings demonstrate and explain the principles of the present invention. The illustrated embodiments are examples of the present invention and do not limit the scope of the invention.

FIG. 3 also represents an exploded view of a bolster plate sub-assembly according to one embodiment of the present invention.

FIG. 5 is an illustration of a screw used in a bolster plate sub-assembly according to one embodiment of the present invention.

DETAILED DESCRIPTION OF THE PREFERRED EMBODIMENTS

Throughout the drawings, identical reference numbers designate similar, but not necessarily identical, elements.

Figure 1:
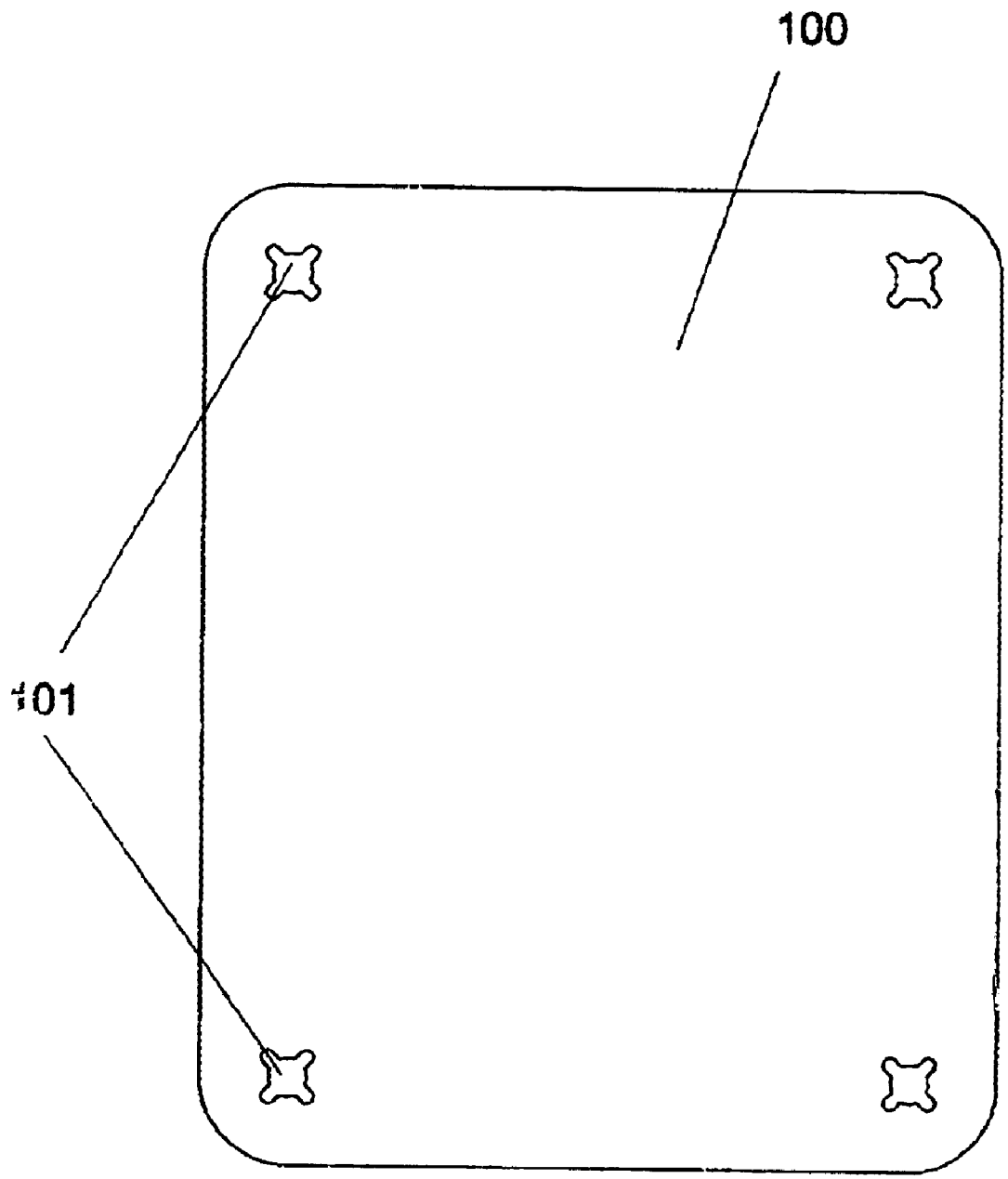
FIG. 1 is an illustration of an insulator for use on a bolster plate according to one embodiment of the present invention.

FIG. 1 illustrates an insulator or sheet of insulation according to one embodiment of the present invention. The insulator (100) of FIG. 1 is sized and shaped to insulate a bolster plate from a server blade or other circuit board being supported by the bolster plate.

As shown in FIG. 1, the insulator (100) may have a generally rectangular shape with rounded corners. This shape may correspond to the shape of the bolster plate which the insulator (100) will be used to insulate.

The insulator (100), according to principles of the present invention, includes one or more holes through the insulator (100). In the embodiment shown in FIG. 1, there are four such holes (101) distributed in the four corners of the rectangular insulation sheet (100).

Figure 2:
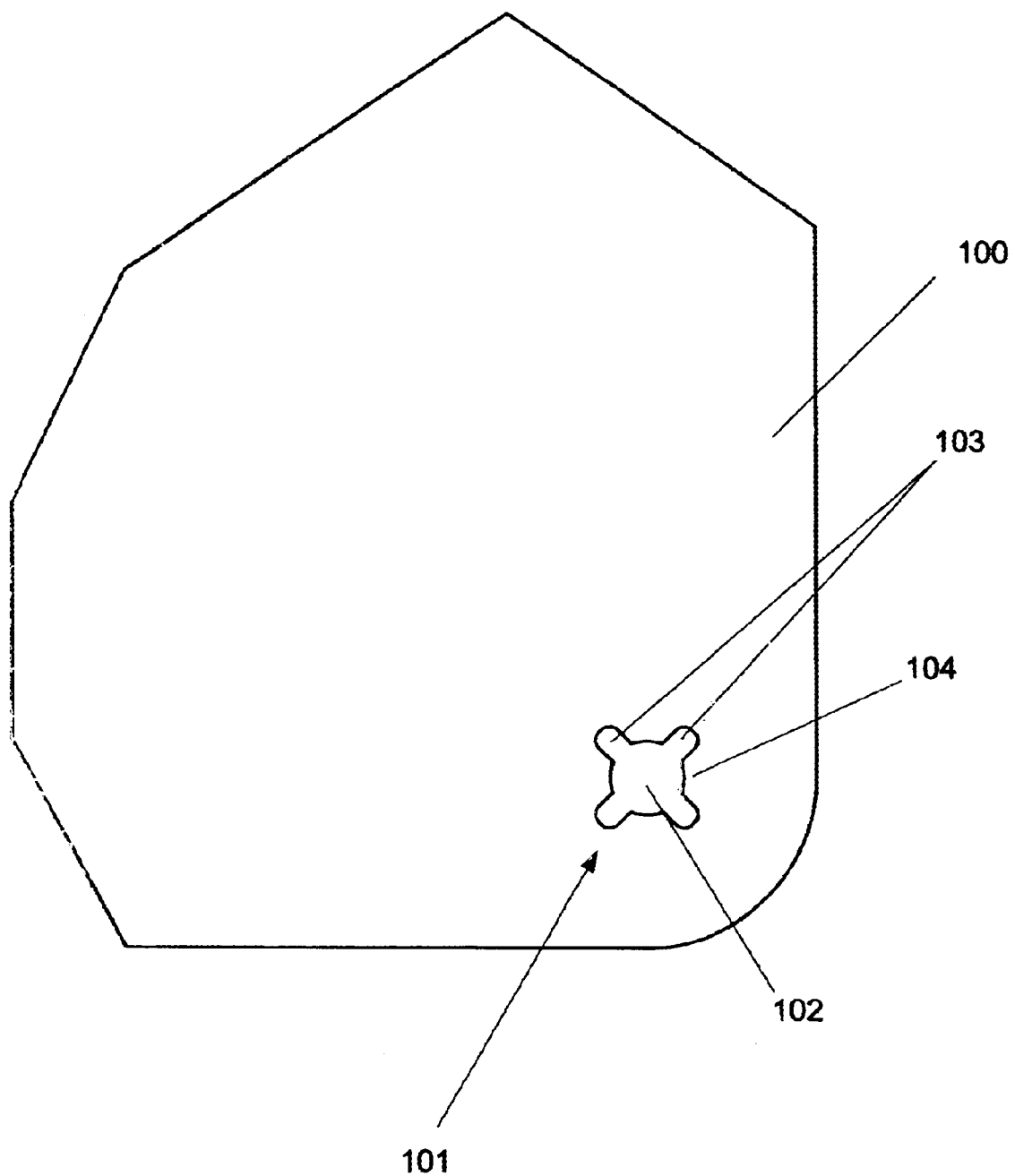
FIG. 2 is a detailed illustration of a hole through the insulator illustrated in FIG. 1.

FIG. 2 is a more detailed illustration of one of the holes through the insulator shown in FIG. 1. As shown in FIG. 2, the hole (101) through the insulator (100) preferably includes a generally round central portion (102).

Extending from this generally round central portion (102) of the hole (101) are additional slots (103) of the hole (101). In the embodiment of FIG. 2, there are four of these slots (103) evenly spaced around the perimeter of the central portion (102) of the hole (101).

These slots (103) of the hole (102) define tabs (104) of insulator (100) that extended into the hole (101) between the slots (103). These tabs (104) are sized to interfere with the threads on a screw that is being driven through the hole (102). Consequently, as will be discussed below, the insulator (100) can be secured to a bolster plate using screws.

Figure 3:
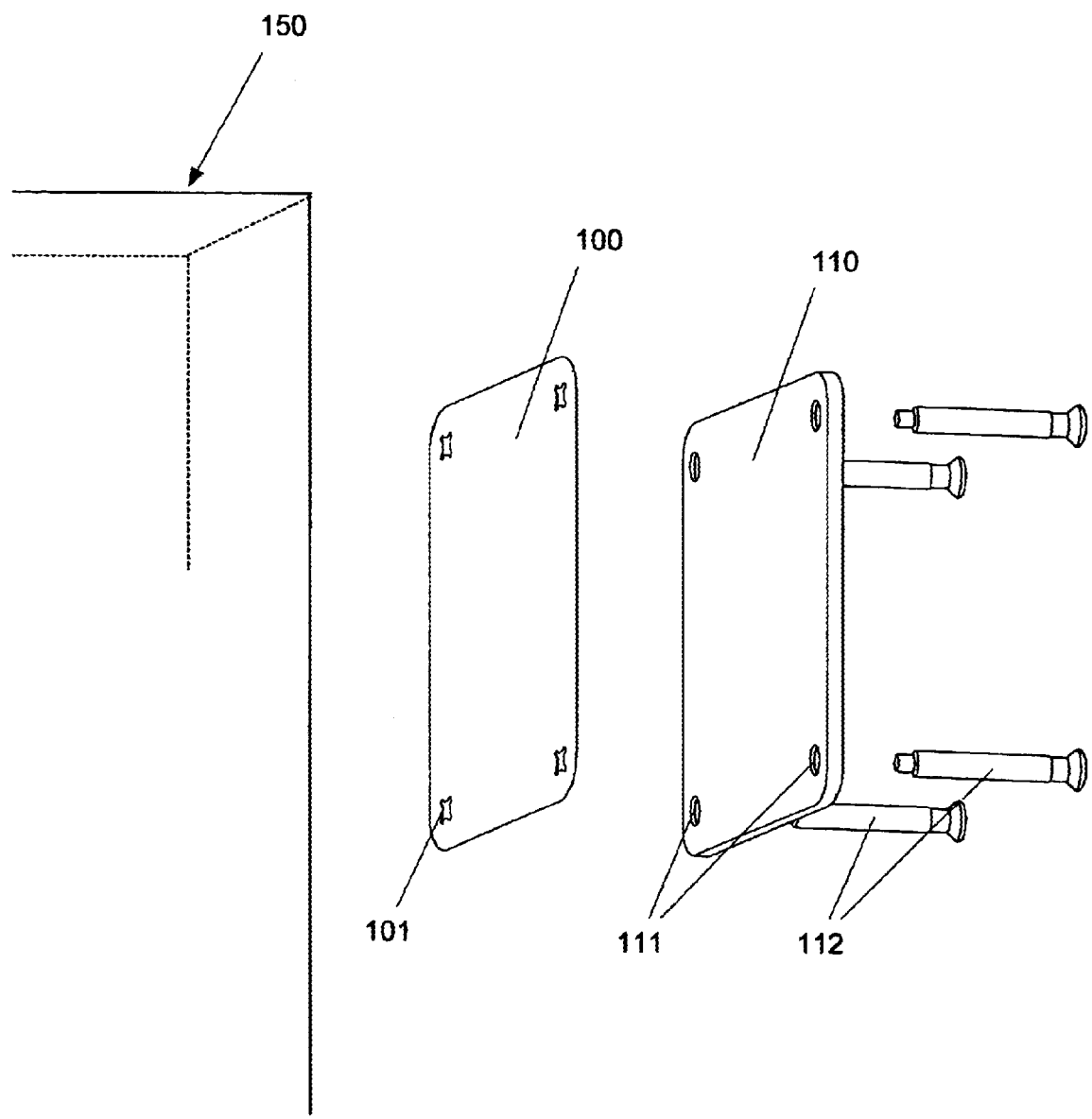
FIG. 3 is an illustration of the insulator of FIG. 1 along with a bolster plate and fastening screws for securing the insulator to the bolster plate according to one embodiment of the present invention.

FIG. 3 is an illustration of the insulator of FIG. 1 along with a bolster plate and fastening screws for securing the insulator to the bolster plate according to one embodiment of the present invention. FIG. 3 also represents an exploded view of a bolster plate sub-assembly according to one embodiment of the present invention.

As shown in FIG. 3, a bolster plate (110) is provided. The bolster plate (110) can be used to structurally support a server blade (150) or other circuit board.

The insulator (100), as noted above, is sized and shaped to insulate the bolster plate (110) from the supported circuit board (not shown). In the embodiment illustrated, the insulator (100) and bolster plate (110) are of essentially the same size and shape, each is generally rectangular with rounded corners.

The bolster plate (110) includes holes (111) therethrough that match the position of the hole or holes (101) in the insulator (100). A screw or screws (112) are threaded through the holes (111) in the bolster plate (110) and the holes (101) in the insulator (100) to secure the insulator (100) and bolster plate (110) together into a captive sub-assembly.

Figure 4:
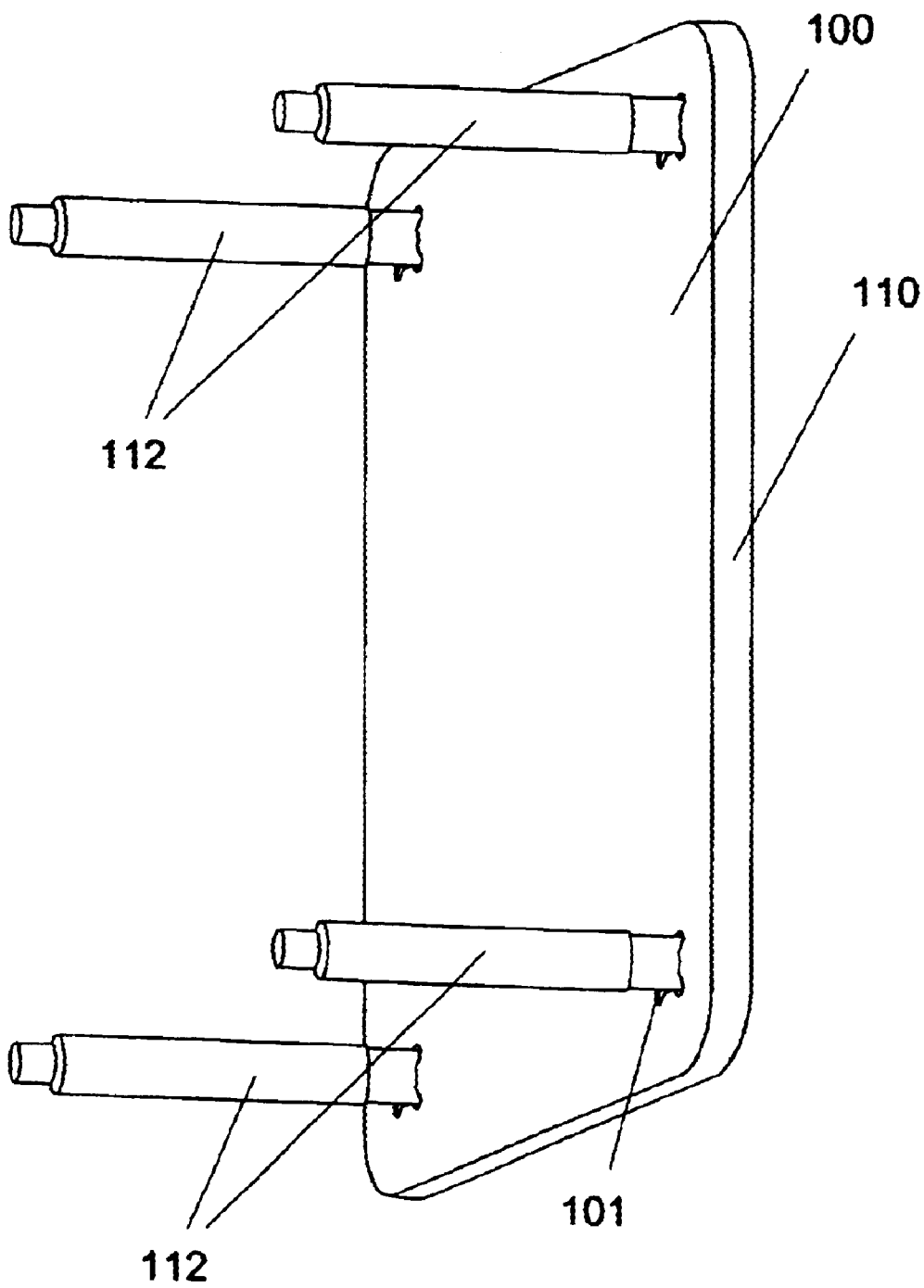
FIG. 4 is an illustration of an assembled bolster plate-insulator sub-assembly according to one embodiment of the present invention.

FIG. 4 illustrates a fully assembled version of the embodiment illustrated in FIG. 3. As shown in FIG. 4, the insulator (100) is placed on the bolster plate (110) so as to insulate the bolster plate (110) from the supported circuit board. The hole or holes (101) in the insulator (100) are aligned with the hole or holes in the bolster plate (110). A screw (112) is then completely threaded through each pair of aligned holes.

The result is a completed sub-assembly that includes the bolster plate (110) to which is secured the insulator (100). The sub-assembly can be secured to the circuit board being supported and/or to other components of the system. The screws (112) may be used to further secure the sub-assembly in place or secure components to the sub-assembly.

FIG. 5 is a more detailed illustration of a screw (112) according to principles of the present invention. As shown in FIG. 5, the screw (112) includes a head (115) from which the screw (112) is driven, a tip (114) and a length along which threads (113) are disposed. As indicated above, the threads (113) interfere with the tabs (104) that extend into the hole (102) in the insulator (100). Thus, the screw (112) can be screwed through the insulator (100).

In one embodiment, the screw shaft, between the threads (113) and the head (115) has a shaft portion (116) that does not bear any threads. This shaft portion (116) is sized to fit through the central portion (102) of the hole (101) in the insulator (100).

When the screw (112) has been screwed completely into the bolster plate (110) and the insulator (100), the insulator (100) and bolster plate (110) are held between the head (115) and threads (113) of the screw (112) on the shaft portion (116). Consequently, the screw (112) can be turned or driven at its head (115), and the screw (112) will rotate freely within the holes (101, 111) in the insulator (100) and the bolster plate (110). The unthreaded portion (116) of the screw (112) will turn freely within the holes (101, 111) in the insulator (100) and the bolster plate (110).

In this way, the screw (112) can be driven to secure the sub-assembly to another component, e.g., the circuit board to be supported by the bolster plate (110). The screw (112) will not be removed from the sub-assembly and the sub-assembly disassembled unless the direction in which the screw (112) is driven is reversed and the screw (112) is unscrewed from the assembly.

When unscrewed, the threads (113) of the screw (112) will again interfere with the tabs (104) in the holes (101) of the insulator (100). This moves the insulator (100) toward the tip (114) of the screw and, eventually, out of engagement with the screw (112).

In another embodiment, the threads on the screw shaft continue to the base of the head. The insulator is typically so thin that even if the threads go all the way to the base of the head the screws can still be driven.

In summary, there are many advantages to the present invention. First, as just explained, the screws (112) are captive in the sub-assembly unless actively unscrewed. Thus, the sub-assembly can be assembled and the screws (112) used to attach the sub-assembly to other components remain captive in the sub-assembly until needed to secure the sub-assembly in place.

Additionally, there is no need to use an adhesive to secure the insulator (100) to the bolster plate (100). Thus, there is no need to source a NEBS 3+ compliant flame-retardant adhesive. There is also no concern about adhesive wicking out from the joint between the bolster plate and the insulator and contaminating the supported circuit board.

It should also be noted that because of these various advantages, the present invention is particularly well suited for use with CompactPCI form factor.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. An insulator for electrically insulating a bolster plate from a circuit board supported by said bolster plate, said insulator comprising:
    a sheet of insulating material sized and shaped to insulate said bolster plate from said circuit board, wherein said sheet of insulating material is separate from said circuit board; and
    at least one hole through said sheet of insulating material for accommodating a fastener for securing said sheet of insulating material to said bolster plate.

2. The insulator of claim 1, wherein said at least one hole further comprises:
    a round central portion; and
    a plurality of slots extending into said sheet of insulating material from said round central portion.

3. The insulator of claim 1, wherein said fastener is a screw.

4. The insulator of claim 1, wherein:
    said sheet of insulating material is substantially rectangular in shape; and
    said at least one hole comprises a hole disposed in each corner of said substantially rectangular sheet of insulating material.

5. The insulator of claim 4, wherein each of said holes further comprises:
    a round central portion; and
    a plurality of slots extending into said sheet of insulating material from said round central portion.

6. A sub-assembly comprising:
    a bolster plate for supporting a circuit board; and
    an insulator for insulating said bolster plate from said circuit board, wherein said insulator is separate from said circuit board;
    wherein said insulator is secured to said bolster plate with one or more fasteners.

7. The sub-assembly of claim 6, wherein said insulator comprises:
    a sheet of insulating material sized and shaped to insulate said bolster plate; and
    at least one hole through said sheet of insulating material for accommodating a said fastener for securing said sheet of insulating material to said bolster plate.

8. The sub-assembly of claim 7, wherein said at least one hole further comprises:
    a round central portion; and
    a plurality of slots extending into said sheet of insulating material from said round central portion.

9. The sub-assembly of claim 7, wherein said fastener is a screw.

10. The sub-assembly of claim 7, wherein:
    said sheet of insulating material is substantially rectangular in shape;
    said at least one hole comprises a hole disposed in each corner of said substantially rectangular sheet of insulating material; and
    said fasteners comprise four screws for securing each corner of said insulating material to said bolster plate.

11. The sub-assembly of claim 10, wherein each of said holes further comprises:
    a round central portion; and
    a plurality of slots extending into said sheet of insulating material from said round central portion.

12. a sub-assembly comprising:
    a bolster plate for supporting a circuit board; and
    an insulator for insulating said bolster plate from said circuit board;
    wherein said insulator is secured to said bolster plate with one or more screws;
    wherein said insulator comprises a sheet of insulating material sized and shaped to insulate said bolster plate and at least one hole through said sheet of insulating material for accommodating a said screw for securing said sheet of insulating material to said bolster plate; and
    wherein said screw comprises:
        a threaded portion;
        a head; and
        an unthreaded portion between said head and said threaded portion;
        wherein said insulating material and said bolster plate are held on said unthreaded portion of said screw between said threaded portion and said head.

13. A sub-assembly comprising:
    a bolster plate for supporting a circuit board;
    an insulator for insulating said bolster plate from said circuit board; and
    one or more screws for securing said insulator to said bolster plate,
    wherein each said screw comprises;
        a threaded portion;
        a head; and
        an unthreaded portion between said head and said threaded portion;
        wherein said insulator and said bolster plate are held on said unthreaded portion of said screw between said threaded portion and said head.

14. The sub-assembly of claim 13, wherein each said screw is held in said sub-assembly until unscrewed because said insulator will not slide over said threaded portion of said screw.

15. The sub-assembly of claim 13, wherein each said screw rotates freely about said unthreaded portion in said insulator and bolster plate.

16. A method of forming a sub-assembly comprising:
    providing a bolster plate for supporting a circuit board;
    providing an insulator for insulating said bolster plate from said circuit board; and
    securing said insulator to said bolster plate with one or more fasteners, prior to connecting said bolster plate and said circuit board.

17. The method of claim 16, wherein said providing said insulator comprises:
    sizing and shaping a sheet of insulating material to insulate said bolster plate; and
    making at least one hole through said sheet of insulating material for accommodating a said fastener for securing said sheet of insulating material to said bolster plate.

18. The method of claim 17, wherein said making at least one hole further comprises:
    making a round central portion; and
    making a plurality of slots extending into said sheet of insulating material from said round central portion.

19. The method of claim 17, wherein said securing said insulator to said bolster plate comprises screwing said insulator to said bolster plate.

20. The method of claim 17, wherein:
said sizing and shaping said sheet of insulating material comprises making said sheet of insulating material substantially rectangular in shape;
said making at least one hole comprises making a hole in each corner of said substantially rectangular sheet of insulating material; and
said securing said insulator to said bolster plate with one or more fasteners comprises securing each corner of said insulating material to said bolster plate with a screw.

21. A method of forming a sub-assembly comprising:
providing a bolster plate for supporting a circuit board;
providing an insulator for insulating said bolster plate from said circuit board; and
securing said insulator to said bolster plate with one or more fasteners;
wherein said securing said insulator to said bolster plate further comprises screwing at least one screw through said insulator and bolster plate, wherein each said screw comprises:
a threaded portion;
a head; and
an unthreaded portion between said head and said threaded portion;
wherein said insulating material and said bolster plate are held on said unthreaded portion of said screw between said threaded portion and said head.

22. The method of claim 21, wherein each said screw is held in said sub-assembly until unscrewed because said insulator will not slide over said threaded portion of said screw.

23. The method of claim 21, wherein each said screw rotates freely about said unthreaded portion in said insulator and bolster plate.

24. The method of claim 23, further comprising installing said sub-assembly by driving each said screw, which rotates freely about said unthreaded portion in said insulator and bolster plate, to screw said screw to a component on which said sub-assembly is to be installed.

25. A sub-assembly comprising:
a bolster plate for supporting a circuit board;
insulating means for insulating said bolster plate from said circuit board, wherein said insulating means are physically separate from said circuit board ; and
fastening means, not including an adhesive, for securing said insulating means to said bolster plate.

26. The sub-assembly of claim 25, wherein said insulating means comprise:
a sheet of insulating material sized and shaped to insulate said bolster plate; and
at least one hole through said sheet of insulating material for accommodating said fastening means for securing said sheet of insulating material to said bolster plate.

27. The sub-assembly of claim 26, wherein said at least one hole further comprises:
a round central portion; and
a plurality of slots extending into said sheet of insulating material from said round central portion.

28. The sub-assembly of claim 26, wherein:
said sheet of insulating material is substantially rectangular in shape;
said at least one hole comprises a hole disposed in each corner of said substantially rectangular sheet of insulating material; and
said fastening means comprise four screws for securing each corner of said insulating material to said bolster plate.

29. The sub-assembly of claim 28, wherein each of said holes further comprises:
a round central portion; and
a plurality of slots extending into said sheet of insulating material from said round central portion.

30. The sub-assembly of claim 25, wherein said fastening means comprise one or more screws.

31. A sub-assembly comprising:
a bolster plate for supporting a circuit board;
insulating means for insulating said bolster plate from said circuit board; and
fastening means, not including an adhesive, for securing said insulating means to said bolster plate;
wherein said fastening means comprise one or more screws; and
wherein each said screw comprises:
a threaded portion;
a head; and
an unthreaded portion between said head and said threaded portion;
wherein said insulating means and said bolster plate are held on said unthreaded portion of said screw between said threaded portion and said head.

32. The sub-assembly of claim 31, wherein each said screw is held in said sub-assembly until unscrewed because said insulating means will not slide over said threaded portion of said screw.

33. The sub-assembly of claim 31, wherein each said screw rotates freely about said unthreaded portion in said insulating means and bolster plate.

34. A sub-assembly comprising:
a bolster plate for supporting a circuit board; and
an insulator for insulating said bolster plate from said circuit board;
wherein said insulator is secured directly to said bolster plate with one or more fasteners.

35. The sub-assembly of claim 34, wherein said insulator comprises:
a sheet of insulating material sized and shaped to insulate said bolster plate; and
at least one hole through said sheet of insulating material for accommodating a said fastener for securing said sheet of insulating material to said bolster plate.

36. The sub-assembly of claim 35, wherein said at least one hole further comprises:
a round central portion; and
a plurality of slots extending into said sheet of insulating material from said round central portion.

37. The sub-assembly of claim 35, wherein said fastener is a screw.

38. A sub-assembly including a blade for use in an ultra-dense server, said sub-assembly comprising:
a bolster plate for supporting said blade; and
an insulator for insulating said bolster plate from said blade;

wherein said insulator is secured to said bolster plate with one or more fasteners and said bolster plate is secured to said blade.

39. The sub-assembly of claim 38, wherein said insulator comprises:
- a sheet of insulating material sized and shaped to insulate said bolster plate; and
- at least one hole through said sheet of insulating material for accommodating a said fastener for securing said sheet of insulating material to said bolster plate.

40. The sub-assembly of claim 39, wherein said at least one hole further comprises:
- a round central portion; and
- a plurality of slots extending into said sheet of insulating material from said round central portion.

41. The sub-assembly of claim 39, wherein said fastener is a screw.

* * * * *